United States Patent [19]

Yokoyama et al.

[11] Patent Number: 5,021,863

[45] Date of Patent: Jun. 4, 1991

[54] SEMICONDUCTOR QUANTUM EFFECT DEVICE HAVING NEGATIVE DIFFERENTIAL RESISTANCE CHARACTERISTICS

[75] Inventors: Naoki Yokoyama; Toshio Fujii, both of Atsugi, Japan

[73] Assignee: Fujitsu Limited, Kawasaki, Japan

[21] Appl. No.: 405,976

[22] Filed: Sep. 12, 1989

[30] Foreign Application Priority Data

Sep. 12, 1988 [JP] Japan .................. 63-226450

[51] Int. Cl.$^5$ ............................ H01L 29/66
[52] U.S. Cl. ...................... 357/57; 357/4; 357/16; 357/61
[58] Field of Search ............ 357/16, 12, 4 SL, 57, 357/34, 34 HB, 22 I, 22 A, 22 MD, 61

[56] References Cited

U.S. PATENT DOCUMENTS

| | | | |
|---|---|---|---|
| 4,198,644 | 4/1980 | Esaki | 357/12 |
| 4,371,884 | 2/1983 | Esaki et al. | 357/12 |
| 4,395,722 | 7/1983 | Esaki et al. | 357/34 |
| 4,780,749 | 10/1988 | Schulman | 357/16 |
| 4,797,722 | 1/1989 | Shannon | 357/16 |
| 4,829,343 | 5/1989 | Levi | 357/16 |

FOREIGN PATENT DOCUMENTS

| | | | |
|---|---|---|---|
| 0210880 | 10/1985 | Japan | 357/57 |
| 61-58268 | 3/1986 | Japan . | |
| 0128559 | 6/1987 | Japan | 357/57 |
| 0205658 | 9/1987 | Japan | 357/16 |

OTHER PUBLICATIONS

Yokoyama et al., "Tunneling Hot Electron ... Heterojunctions", Japanese Journal of Applied Physics, vol. 23, No. 5, 5/1984.
Luryi, "An Induced Base Hot Electron Transistor", IEEE, 1985.
Y. Arakawa & T. Ikoma, Trans. I.E.I.C.E. Japan, vol. J70-C, No. 5, May 1987, pp. 592-602, "Semiconductor Quantum Effect Devices".
N. Yokoyawa et al., Japanese J. Appl. Phys., vol. 24, No. 11, Nov. '85, pp. L853-854, "A New Functional, Resonant-Tunneling Hot Electron Transistor (RHET)".

Primary Examiner—Rolf Hille
Assistant Examiner—Minhloan Tran T.
Attorney, Agent, or Firm—Staas & Halsey

[57] ABSTRACT

A semiconductor quantum effect device having negative differential resistance characteristics includes a composite potential barrier layer including a first potential barrier layer and a second potential barrier layer; a carrier injection side semiconductor layer connected in contact with the first potential barrier layer; and a carrier injected side semiconductor layer connected in contact with the second potential barrier layer. The semiconductor material elements forming the respective layer satisfy the condition that, when the voltage is not applied to the semiconductor material elements, the energy level at the bottom of conduction band in the carrier injection side semiconductor layer and in the carrier injected side semiconductor layer is lower than the energy level at the top of the valance band in the second potential barrier layer and that a Fermi level within the second potential barrier layer is nearly at the same level as the Fermi level within the barrier injected side semiconductor layer, and an electron and a hole are operated in a cooperative relation therebetween.

7 Claims, 7 Drawing Sheets

SEMICONDUCTOR QUANTUM EFFECT DEVICE HAVING NEGATIVE DIFFERENTIAL RESISTANCE CHARACTERISTICS

BACKGROUND OF THE INVENTION

1. Field of the Invention

The present invention relates to a semiconductor quantum effect device, and more particularly to an improved semiconductor device having negative differential resistance characteristics, and able to effect a high speed operation.

2. Description of the Related Art

Multibarrier tunneling is currently of great interest in the field of semiconductor quantum effect device research, primarily based on advances in crystal growth techniques, such as the hetero-junction growth technique. Accordingly, the research and development of a semiconductor device utilizing a tunneling effect has been flourishing. Above all, a resonant-tunneling device is intended for development as a high frequency oscillating device or a higher functional device and efforts in many fields are being devoted to their application.

In general, the above-described semiconductor device having a tunneling-effect is utilized to apply the potential in a conduction band or a valence band, the potential of which is determined univocally by what material is applied thereto. As is the case with the above-noted resonant-tunneling device, the improvement of electrical characteristics was dealt with by selecting an appropriate value of the shape and scale of potential configuration, such as the height or thickness of potential barriers.

According to the above-described prior art technology, when the shape and dimension of potential barriers are designed, enough freedom of design was not allowed so that limitation of design existed in order that the above-described electrical characteristics, for example, the ratio of peak current to valley current, that is, P/V ratio, or the peak current density, may be improved.

The present invention is devised to solve such a problem. Therefore, it is an object of the present invention to provide a semiconductor quantum effect device having negative differential resistance characteristics and provided with potential barrier layers which can be tunneled through to lead to a greater freedom of design.

SUMMARY OF THE INVENTION

In accordance with the present invention, there is provided a semiconductor quantum effect device having negative differential resistance characteristics including: a composite potential barrier layer including a first potential barrier layer and a second potential barrier layer; a carrier injection side semiconductor layer connected in contact with the first potential barrier layer; and a carrier injected side semiconductor layer connected in contact with the second potential barrier layer, wherein the semiconductor material elements forming the respective layers satisfy the condition that, when voltage is not applied to the semiconductor material elements, the energy level at the bottom of the conduction band in each of the carrier injection side semiconductor layer and the carrier injected side semiconductor layer is lower than the energy level at the top of the valence band in the second potential barrier layer and that a Fermi level within the second potential barrier layer is at the same level as the Fermi level within the carrier injected side semiconductor layer.

In accordance with a semiconductor quantum effect device having negative differential resistance characteristics of the present invention, this semiconductor quantum effect device includes a composite potential barrier layer in which a potential barrier layer, sandwiched between a carrier injection side semiconductor layer and a carrier injected side semiconductor layer, is formed by a first potential barrier layer and a second potential barrier layer.

By adopting such constitution, the device of the present invention can be provided with the following merits:

(a) The semiconductor quantum effect device can be provided with negative differential resistance characteristics;

(b) Both the shape and dimension of the potential in the conduction band and the valence band and the above-noted negative differential resistance characteristics, can be controlled over a wide range.

(c) Even if a comparatively low voltage is applied to the above-semiconductor, tunneling current can flow therethrough.

(d) The peak current depends upon the first semiconductor material and can be changed independently of the valley current.

(e) The voltage region in which the tunneling current is not flowing, is capable of being controlled by selecting the second semiconductor material or the thickness thereof, regardless of the function of the potential barrier.

(f) The tunneling effect in use is not restricted to the life of the resonance state, since it does not depend on the resonance. Therefore, the tunneling effect is more advantageous.

With regard to the resonant-tunneling element in the prior art, the response time can not be made faster than the life of the resonance state.

(g) Further, this quantum effect device can be used for a collector barrier of the resonant-tunneling hot electron transistor, but not used for a resonance barrier.

BRIEF DESCRIPTION OF THE DRAWINGS

FIG. 1 is the energy band diagram when a voltage is not applied, FIG. 2 when a voltage is applied, FIG. 3 when a high voltage is applied and FIG. 4 when a still higher voltage is applied;

DETAILED DESCRIPTION OF THE INVENTION

Figure 1:
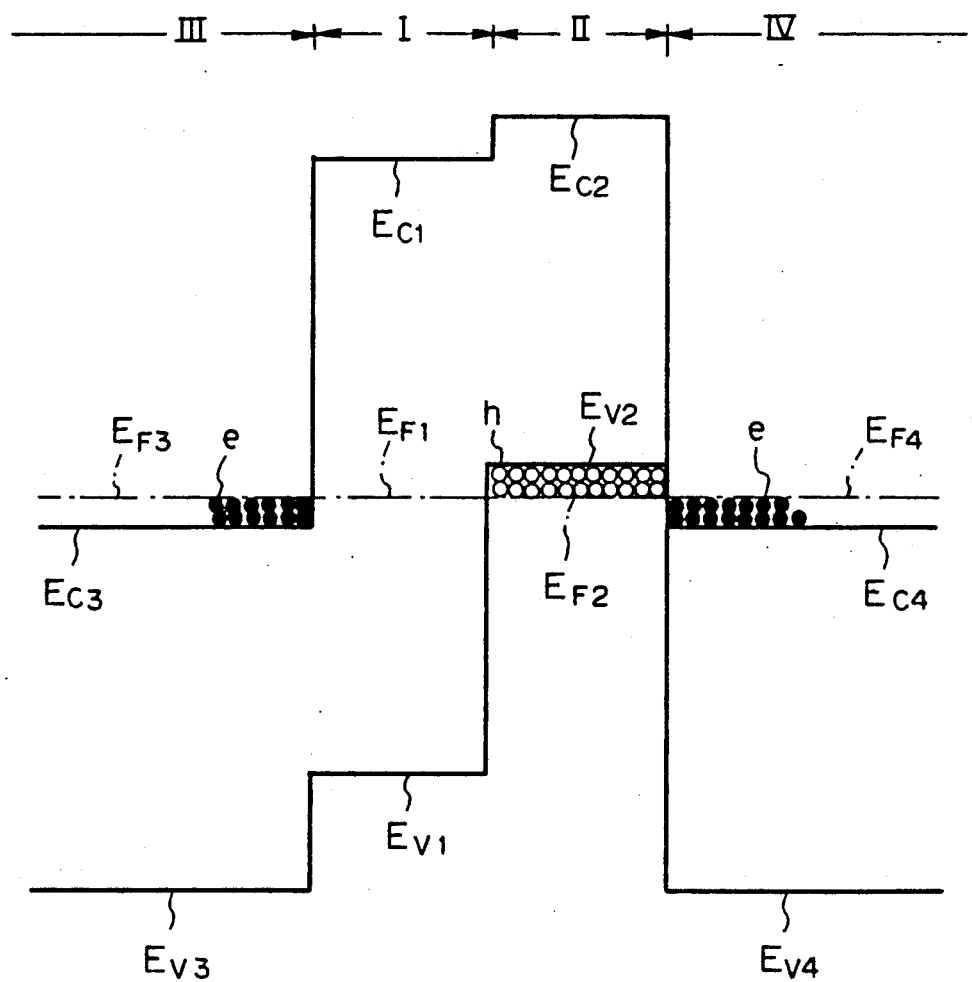
FIG. 1 to FIG. 4 are energy band diagrams of an embodiment of a semiconductor quantum effect device in accordance with the present invention.

In the drawings, FIG. 1 to FIG. 4 are the energy band diagrams regarding a semiconductor device for explaining the principle of the present invention. FIG. 1 shows a voltage non-applied state, FIG. 2 a voltage applied state, FIG. 3 a high voltage applied state and FIG. 4 a still higher voltage applied state.

In FIGS. 1 to 4, I denotes a first potential barrier layer forming a composite potential barrier layer, II a second potential barrier layer forming also a composite potential barrier layer, III a carrier injection side semiconductor layer, IV a carrier injected side semiconductor layer, $E_{F1}$, $E_{F2}$, $E_{F3}$ and $E_{F4}$ the Fermi level in the respective semiconductor layers, $E_{C1}$, $E_{C2}$, $E_{C3}$, and $E_{C4}$ the bottom of the conduction band in the respective semiconductor layers, $E_{V1}$, $E_{V2}$, $E_{V3}$ and $E_{V4}$ the top of the valence band in the respective semiconductor layers, "e" an electron, and "h" a hole, respectively.

In the semiconductor device, a potential barrier is constituted by a composite potential barrier layer which is formed by a first potential barrier layer I and a second potential barrier layer II. The first potential barrier layer I in which an energy band gap is larger, is selected, for example, as an i-type, the second potential barrier layer II in which an energy band gap is smaller, for example, as a p-type, and the carrier injection side semiconductor layer III and the carrier injected side semiconductor layer IV both as an n-type. In this case, the carrier injection side semiconductor layer III is made to be a cathode and the carrier injected side semiconductor layer IV to be an anode.

In a voltage non-applied state, that is, in a thermal equilibrium state, since an energy level of the bottoms $E_{C3}$ and $E_{C4}$ of the conduction band in the carrier injection side semiconductor layer III and the carrier injected side semiconductor layer IV are lower than an energy level of the to $E_{V2}$ of the valence band in the second potential barrier layer II in contact with the carrier injected side semiconductor layer IV, and since the interface of the second potential barrier layer II and the carrier injected side semiconductor layer IV is in a semimetallic state in which holes and electrons coexist, the Fermi level $E_{F2}$, that is, the electric potential in the second potential barrier layer II, is equivalent to the Fermi level $E_{F3}$, that is, the electric potential in the carrier injected side semiconductor layer III.

Figure 2:
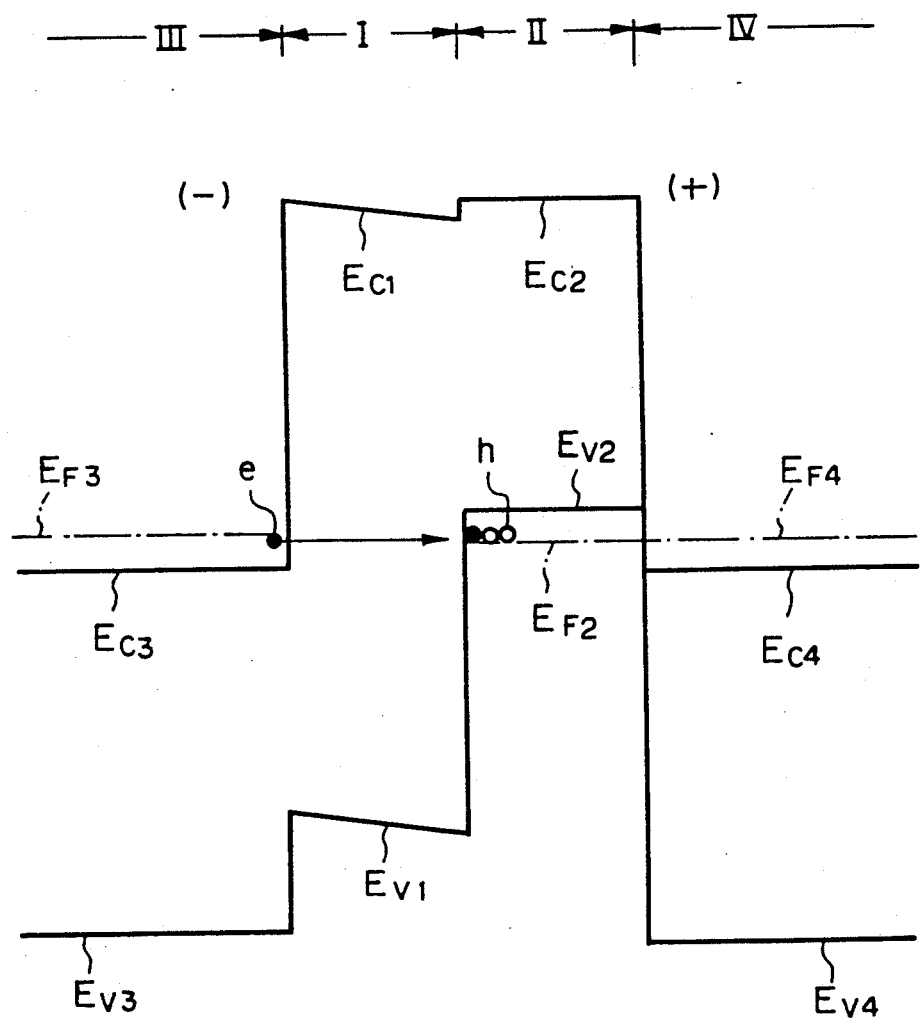

FIG. 2 is a diagram showing a state of the polarity which the carrier injection side semiconductor layer III is negative and the carrier injected side semiconductor layer IV is positive, when a lower voltage such as some dozens of mV is applied thereto.

When the bottom $E_{C3}$ of the conduction band in the carrier injection side semiconductor layer III is raised and made the same level as the top $E_{V2}$ of the valence band of the second potential barrier layer II in the composite potential barrier layer, the probability that an electron e in the carrier injection side semiconductor layer III may tunnel through the first potential barrier layer I increases rapidly, and accordingly a great many electrons are produced in the carrier injected side semiconductor layer IV and high tunneling current begins to flow in the semiconductor device.

Figure 3:
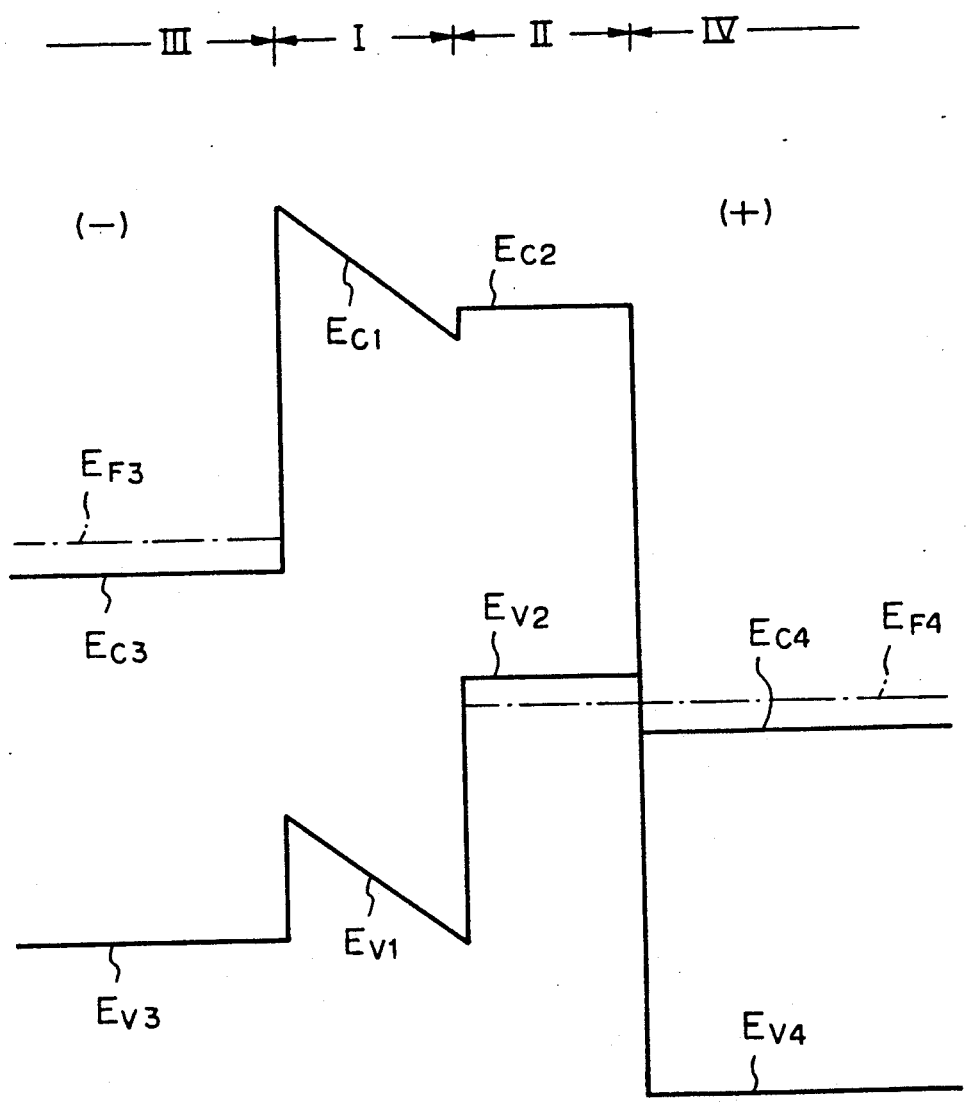

FIG. 3 shows a case when the higher voltage is applied in the state described in FIG. 2.

When an applied voltage is higher, the probability of an electron e, tunneling from the conduction band in the carrier injection side semiconductor layer III to the valence band in the second potential barrier layer II, is reduced since the bottom potential $EC_3$ of the conduction band in the carrier injection side semiconductor layer III is higher than the top potential $EV_2$ of the valence band in the second potential barrier II. Therefore, electrons are not injected thereto and tunneling current cannot flow in the semiconductor device.

Figure 4:
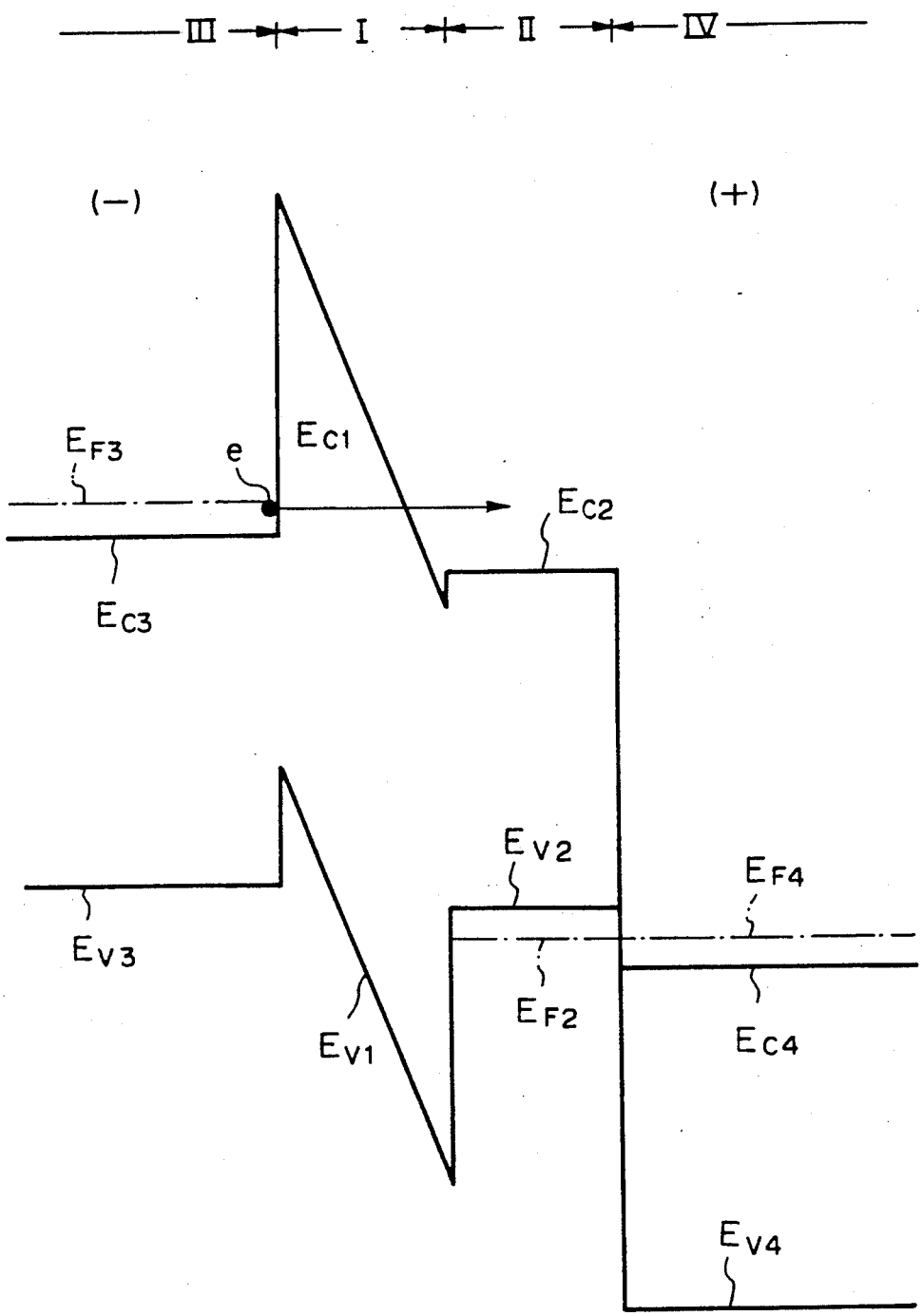

FIG. 4 shows a case when the applied voltage is still higher than in the state described in FIG. 3.

When an applied voltage is high enough, the bottom $E_{C3}$ of the conduction band in the carrier injection side semiconductor layer III is further raised to go over the bottom $E_{C2}$ of conduction band in the second potential barrier layer II. Moreover, since the first potential barrier layer I inclines steeply toward the carrier injected side, the barrier is thin thereat, and an electron e from the carrier injection side semiconductor layer III appears immediately in the carrier injected side semiconductor layer IV, so that a tunneling current begins to flow again in the semiconductor device.

As is seen from the afore-mentioned description, negative differential resistance characteristics occur in the current flowing through the semiconductor device according to the present invention.

Figure 5:
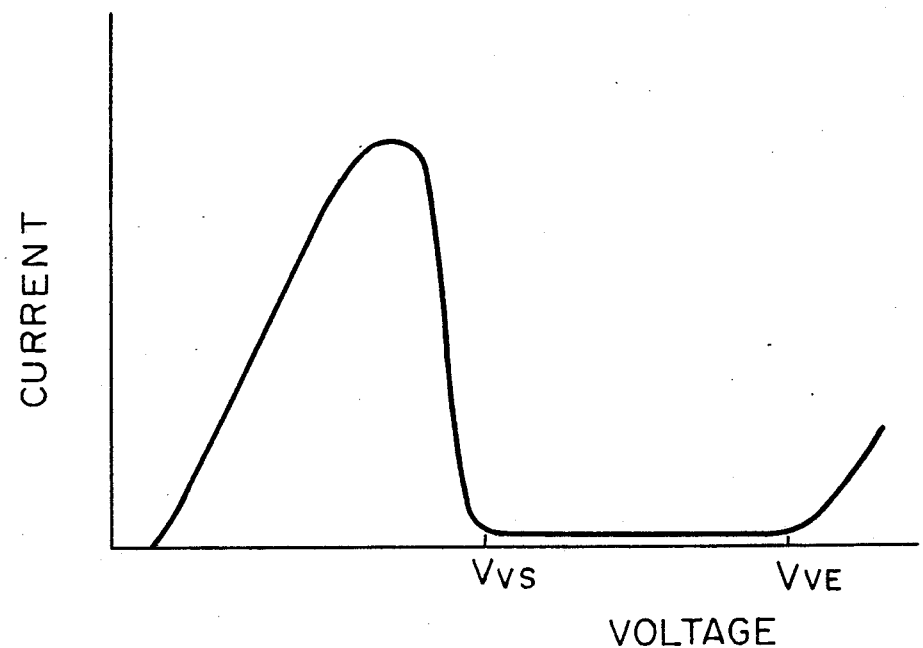
FIG. 5 is a V-I characteristic curve in the semiconductor device according to the present invention.

FIG. 5 is a diagram showing voltage vs. current characteristics in the semiconductor device according to the present invention.

As is apparent from the characteristic curve shown in the figure, the semiconductor device according to the present invention has a negative differential resistance characteristic. The voltage region $V_{VS}$ to $V_{VE}$ shows a voltage range in which the state described in FIG. 3 can be maintained. That is, the voltage range from $V_{VS}$ to $V_{VE}$ is the time period in which the applied voltage is made higher than in the state as seen in FIG. 2, the bottom potential $E_{C3}$ of the conduction band in the carrier injection side semiconductor layer III is raised, and the tunneling current is interrupted, then the applied voltage is made higher and the tunneling current can flow again. In the region of the voltage range $V_{VS}$ to $V_{VE}$, the negative differential resistance characteristics is in a valley state.

From the above description, in accordance with the present invention, there is provided a semiconductor quantum effect device including: a composite potential barrier layer including a first potential barrier layer (for example, the first potential barrier layer I) and a second potential barrier layer (for example, the second potential barrier layer II); a carrier injection side semiconductor layer in contact with the first potential barrier layer (for example, the carrier injection side semiconductor layer III); and a carrier injected side semiconductor layer in contact with the second potential barrier layer (for example, the carrier injected side semiconductor layer IV), wherein the semiconductor material elements forming the above respective layers satisfy the condition that, when voltage is not applied to the semiconductor material elements, the energy level at the bottom of the conduction band in each of the carrier injection side semiconductor layer and the carrier injected side semiconductor layer (for example, the bottoms $E_{C3}$ and $E_{C4}$ of the conduction band) is lower than the energy level at the top of the valence band in the second potential barrier layer and that a Fermi level within the second potential barrier layer (for example, Fermi level $E_{F2}$) is nearly at the same level as the Fermi level within the carrier injected side semiconductor layer (for example, Fermi level $E_{F4}$).

Based on the adaption of the afore-mentioned means for solving the prior art problems, without being troubled by the restrictions of the potential barrier capable of being tunneled therethrough, it is possible to appropriately select a semiconductor material for forming the first and second potential barrier layers, or their depth, to design an arbitrary shape and dimension of potential. Furthermore, it is possible to control the voltage range to realize a valley state up to a broad extent regarding a negative differential resistance characteristic in which even the application of a much lower voltage enables flowing of the tunneling current or disables flowing of the tunneling current. Compared with a prior art resonant-tunneling semiconductor device that can not adopt only an extremely narrow voltage range such as a voltage range equivalent to a certain point, there is a great difference between the prior art resonant tunneling device and the present invention. The solution of restraining the valley-current to a low value can be dealt with easily by thickening the second potential barrier layer appropriately. Still more, the means for restraining the valley-current to a low value can be determined independent of, and be nearly irrelevant to, the condition that the carrier can make the composite potential barrier layer tunnel therethrough.

Figure 6:
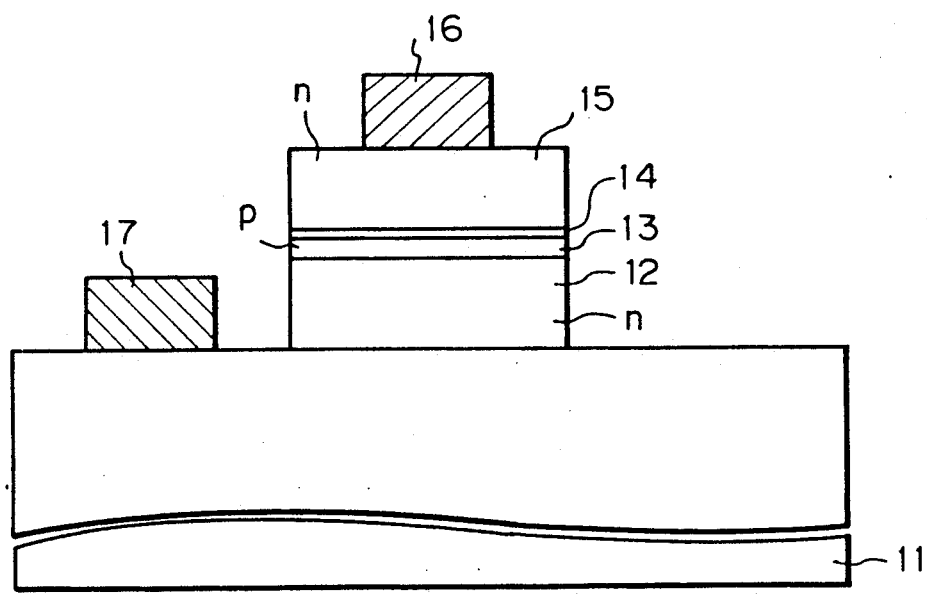
FIG. 6 is a general, illustrative cross-sectional and elevational view of an embodiment in accordance with the present invention.

FIG. 6 is a general, illustrative cross-sectional side and elevational view of an embodiment in accordance with the present invention.

In FIG. 6, reference numeral 11 denotes a substrate made of GaSb (gallium antimonide), 12 a carrier injected side semiconductor layer made of InAs (indium arsenide), 13 a second potential barrier layer made of GaSb, 14 a first potential barrier layer made of Ga$(As_{0.5}Sb_{0.5})$, 15 a carrier injection side semiconductor layer made of InAs, 16 a carrier injection side electrode and 17 a carrier injected side electrode, respectively.

Some principal data are exemplified as follows.

1. Carrier injected side semiconductor layer 12

Thickness: 0.2 [μm]
Conduction type: n
Impurity concentration: $1 \times 10^{18}$ [cm$^{-3}$]

2. Second potential barrier layer 13

Thickness: 100 [angstrom]
Conduction type: p
Impurity concentration: $1 \times 10^{18}$ [cm$^{-3}$]

3. First potential barrier layer 14

Thickness: 50 [angstrom]
Conduction type: non-doped

4. Carrier injection side semiconductor layer 15

Thickness: 0.2 [μm]
Conduction type: n
Impurity concentration: $1 \times 10^{18}$ [cm$^{-3}$]

A positive polarity voltage is applied to the carrier injected side electrode 17 which contacts with the carrier injected side semiconductor layer 12 in the semiconductor device according to the present invention, a negative polarity of voltage is applied to the carrier injection side electrode 16 which contacts with the carrier injection side semiconductor layer 15 and voltage vs. current characteristics are measured, then a negative differential resistance characteristic curve is observed in the same way as in FIG. 5.

Furthermore, when the respective conduction types of the layers in the afore-mentioned items 1, 2 and 4 are reversed, to n from p or vice versa, and a reverse biasing voltage is applied, the same operation can be effected as in the above example.

Figure 7:
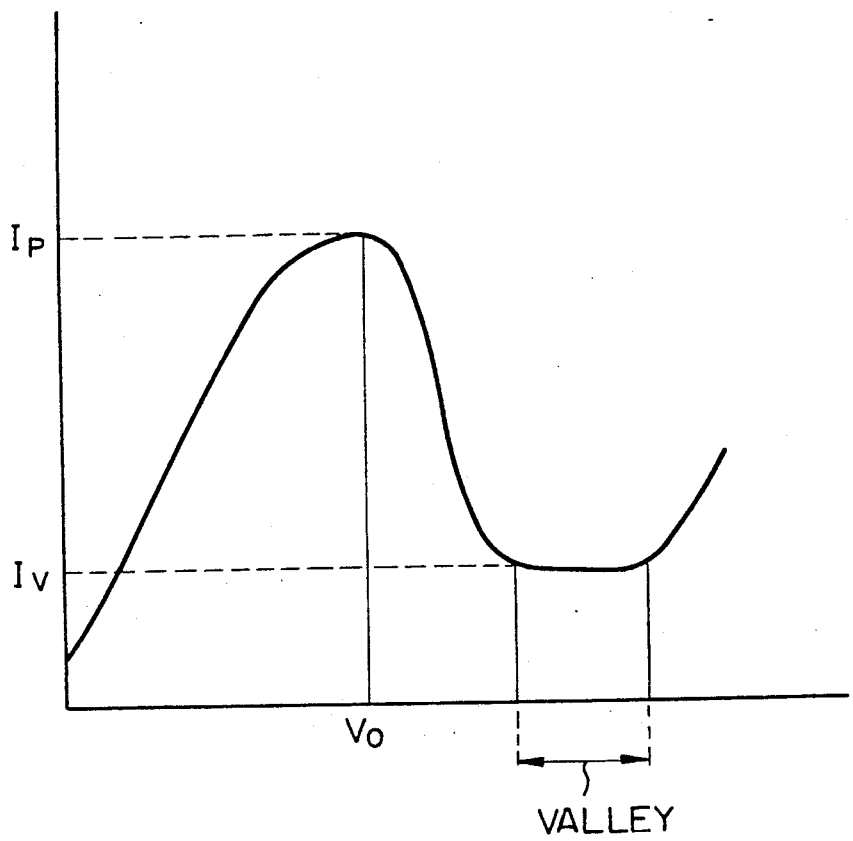
FIG. 7 is a negative differential resistance characteristic curve for explaining the merits of the quantum effect.

FIG. 7 is a negative differential resistance characteristic curve for explaining the merit of the quantum effect.

In a resonant-tunneling diode, the condition that a peak current $I_p$ is larger and a valley current $I_V$ is smaller, is considered to contribute to the improvement of the application performance of the device. The peak current $I_p$ is dependent on the thickness and the height of the barrier, and the width of a well, while the valley current is dependent on the thickness and height of the barrier, the width of the well and scattering at the well.

Another embodiment of the present invention will be described with reference to FIG. 8.

Figure 8:
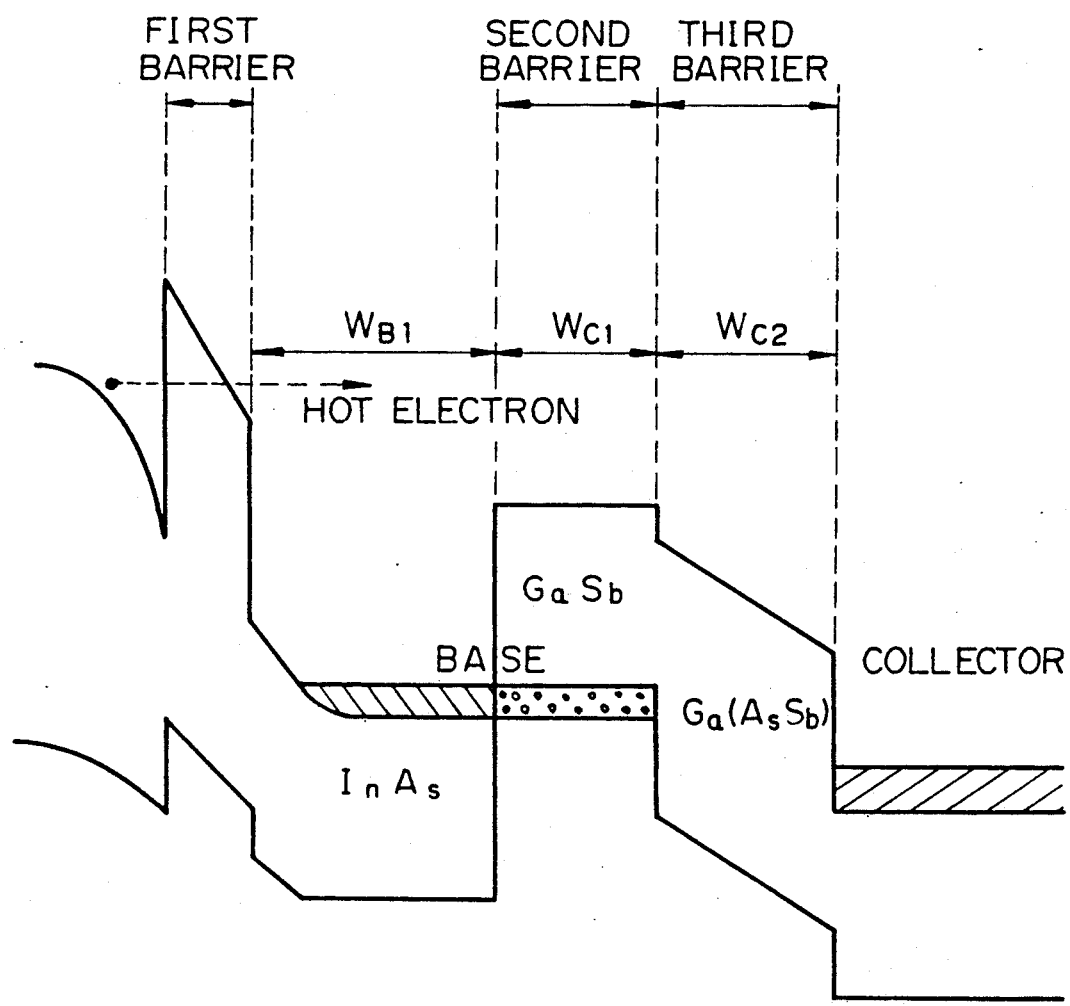
FIG. 8 is an energy band diagram of a hot electron transistor of another embodiment of the invention.

FIG. 8 denotes an energy band diagram of a hot electron transistor (for example, GaAs/AlGaAs HET). The hot electron transistor (HET) is a current injection control type transistor and a unipolar transistor, so that there is no restriction to the injection efficiency, it is possible to effect a voltage scaling and the transit time of the device is exceedingly short due to the high speed hot electron transportation, in view of a hot electron. The current gain and the base transit time depends upon the characteristic of $W_{B1}$. The base resistance is determined by the width of $W_{B1}$ plus $W_{C1}$.

The hot electron tunneled through the just barrier gained high potential energy and proceeds to the second barrier. At this time, if the base width is thinner, the transit time in the base is smaller and the current gain is increased, without much increase of the base resistance.

In FIG. 8, the current gain does not depend on the voltage between the base and the collector, and the output conductance is small. When the voltage is applied between the base and the collector, the gradient at $W_{C2}$, only, changes and therefore, the shape of $W_{C1}$ remains the same. The current gain is almost decided solely determined by the shape of $W_{C1}$, and therefore, the current gain does not depend on the voltage between the base and the collector. Accordingly, the output conductance is reduced.

We claim:

1. A semiconductor quantum effect device having negative differential resistance characteristics comprising:
   a composite potential barrier layer including a first potential barrier layer and a second potential barrier layer, said second potential barrier layer having a valance band with a top energy level;
   a carrier injection side semiconductor layer in contact with said first potential barrier layer, said carrier injection side semiconductor layer having a conduction band with a bottom energy level; and
   a carrier injected side semiconductor layer in contact with said second potential barrier layer, said injected side semiconductor layer having a conduction band with a bottom energy level; p1 each said layer being formed of a semiconductor material, and the respective semiconductor materials forming said composite potential barrier layer, said carrier injection side semiconductor layer and said carrier injected side semiconductor layer are chosen to satisfy the condition that the bottom energy levels of the conduction bands in said carrier injection side semiconductor layer and said carrier injected side semiconductor layer are lower than the top energy level of the valence band in said second potential barrier layer when voltage is not applied across the semiconductor material elements so that a Fermi level within said second potential barrier layer is at the same level as a Fermi level within said carrier injected side semiconductor layer.

2. A semiconductor quantum effect device according to claim 1, wherein said device is a negative differential mode diode.

3. A semiconductor quantum effect device according to claim 1, wherein said carrier injected side semiconductor layer is made of indium arsenide, and has a conduction type of n and an impurity concentration of $1 \times 10^{18}$ cm$^{-3}$.

4. A semiconductor quantum effect device according to claim 1, wherein said second potential barrier layer is made of gallium antimonide, and has a conduction type of p and an impurity concentration of $1 \times 10^{18}$ cm$^{-3}$.

5. A semiconductor quantum effect device according to claim 1, wherein said first potential barrier layer is made of Ga(As$_{0.5}$Sb$_{0.5}$) and has a non-doped conduction type and a thickness of 50 angstrom.

6. A semiconductor quantum effect device according to claim 1, wherein said carrier injection side semiconductor layer is made of indium arsenide, and has a conduction type of n and has an impurity concentration of $1 \times 10^{18}$ cm$^{-3}$.

7. A semiconductor quantum effect device having negative differential resistance characteristics comprising:
   a composite potential barrier layer including a first potential barrier layer and a second potential barrier layer, said first and second potential barrier layers each having a valance band with a top energy level;
   a carrier injection side semiconductor layer in contact with said first potential barrier layer, said carrier injection side semiconductor layer having a conduction band with a bottom energy level; and
   a carrier injected side semiconductor layer in contact with said second potential barrier layer, said injected side semiconductor layer having a conduction band with a bottom energy level;
   each said layer being formed of a semiconductor material, and the respective semiconductor materials forming said composite potential barrier layer, said carrier injection side semiconductor layer and said carrier injected side semiconductor layer are chosen to satisfy the condition that the bottom energy levels of the conduction band in said carrier injection side semiconductor layer and said carrier injected side semiconductor layer are lower than the top energy level of the valence band in one of said first and second potential barrier layers and is higher than the top energy level of the valence band of another of said first and second potential barrier layers when voltage is not applied across the semiconductor material elements so that a Fermi level within said second potential barrier layer is at the same level as a Fermi level within said carrier injected side semiconductor layer.

* * * * *

UNITED STATES PATENT AND TRADEMARK OFFICE
CERTIFICATE OF CORRECTION

PATENT NO. : 5,021,863

DATED : June 4, 1991

INVENTOR(S) : Yokoyama et al.

It is certified that error appears in the above-identified patent and that said Letters Patent is hereby corrected as shown below:

Col. 3, line 32, "to" should be --top--;
      line 43, before "which" insert --in--.

Col. 5, line 21, delete "side".

Col. 6, line 35, delete "decided";
      line 55, delete "p1".

Signed and Sealed this

Twenty-ninth Day of December, 1992

Attest:

DOUGLAS B. COMER

Attesting Officer     Acting Commissioner of Patents and Trademarks